(12) United States Patent
Ruppert

(10) Patent No.: US 11,749,580 B2
(45) Date of Patent: Sep. 5, 2023

(54) ARRANGEMENT FOR ELECTRONIC COMPONENTS

(71) Applicant: AUDI AG, Ingolstadt (DE)

(72) Inventor: Daniel Ruppert, Lenting (DE)

(73) Assignee: AUDI AG, Ingolstadt (DE)

( * ) Notice: Subject to any disclaimer, the term of this patent is extended or adjusted under 35 U.S.C. 154(b) by 200 days.

(21) Appl. No.: 17/072,373

(22) Filed: Oct. 16, 2020

(65) Prior Publication Data

US 2021/0175144 A1 Jun. 10, 2021

(30) Foreign Application Priority Data

Dec. 10, 2019 (DE) .......................... 102019133678.3

(51) Int. Cl.
*H01L 23/473* (2006.01)
*H01L 23/367* (2006.01)
*H01L 23/40* (2006.01)

(52) U.S. Cl.
CPC ...... *H01L 23/3677* (2013.01); *H01L 23/4006* (2013.01); *H01L 23/473* (2013.01)

(58) Field of Classification Search
CPC ............. H01L 23/3672; H01L 23/3677; H01L 23/4006; H01L 23/473; H01L 25/072; H01L 25/16; H01L 25/18; H01L 23/00–66
See application file for complete search history.

(56) References Cited

U.S. PATENT DOCUMENTS

| 6,049,459 | A * | 4/2000 | Edmonds | H01L 23/4006 174/16.3 |
| 7,054,158 | B2 * | 5/2006 | Kimmich | H01L 23/4093 165/185 |
| 8,130,499 | B2 * | 3/2012 | Ohnishi | H01L 23/3735 174/16.3 |
| 10,149,413 | B1 * | 12/2018 | Dede | H05K 7/20927 |
| 2005/0035438 | A1 * | 2/2005 | Shibuya | H01L 23/3737 257/E23.098 |
| 2005/0135065 | A1 * | 6/2005 | Nakatsu | H01L 25/115 257/E25.026 |
| 2006/0202325 | A1 * | 9/2006 | Coico | H01L 23/4006 257/E23.084 |

(Continued)

FOREIGN PATENT DOCUMENTS

DE 102015106151 A1 10/2016
DE 102016207701 A1 11/2016

(Continued)

OTHER PUBLICATIONS

German Examination Report dated Aug. 4, 2020 in corresponding German Application No. 102019133678.3; 8 pages; Machine translation attached.

(Continued)

*Primary Examiner* — Bryan R Junge
(74) *Attorney, Agent, or Firm* — Maier & Maier, PLLC

(57) ABSTRACT

An arrangement which has at least one semiconductor module made of silicon carbide, a driver circuit for the at least one semiconductor module, and a cooling system, wherein the at least one semiconductor module and the driver circuit are arranged adjacent to one another, wherein the driver circuit is connected to the cooling system.

18 Claims, 3 Drawing Sheets

(56) References Cited

U.S. PATENT DOCUMENTS

| | | | | |
|---|---|---|---|---|
| 2013/0277820 A1* | 10/2013 | Hotta | ............ | H01L 23/473 |
| | | | | 257/712 |
| 2013/0285234 A1* | 10/2013 | Uhlemann | ............ | H01L 23/367 |
| | | | | 257/782 |
| 2014/0246768 A1* | 9/2014 | Soyano | ............ | H01L 23/564 |
| | | | | 257/691 |
| 2015/0189772 A1* | 7/2015 | Prajuckamol | ....... | H01L 23/4093 |
| | | | | 29/25.01 |
| 2017/0341638 A1 | 11/2017 | Sawada | | |
| 2018/0116076 A1* | 4/2018 | Dede | ............ | H01L 35/30 |
| 2018/0350716 A1* | 12/2018 | Samples | ............ | H01L 23/4006 |
| 2019/0103344 A1* | 4/2019 | Fukase | ............ | H01L 23/49575 |
| 2020/0294885 A1* | 9/2020 | Fuergut | ............ | H01L 23/49548 |

FOREIGN PATENT DOCUMENTS

| | | |
|---|---|---|
| DE | 112016005528 T5 | 8/2018 |
| DE | 102017222446 A1 | 6/2019 |
| EP | 3285296 A1 | 2/2018 |

OTHER PUBLICATIONS

Examination Report dated Apr. 1, 2023, in corresponding German Application No. 102019133678.3, 6 pages.

* cited by examiner

ARRANGEMENT FOR ELECTRONIC COMPONENTS

FIELD

The disclosure relates to an arrangement which has a semiconductor module, a driver circuit, and an active cooling system as electronic components.

BACKGROUND

When operating power electronics, heat is generated that is to be appropriately dissipated.

According to the prior art, gate driver circuits are implemented using discrete components on conventional PCBs. The components are cooled by free convection in air at the ambient temperature in the interior of the power electronics. The ambient temperature in the interior of the power electronics can be up to 100° C., depending on the operating point and installation position. At most cooling plates are attached to driver ICs for this purpose in order to improve the cooling by convection by way of a larger surface. However, this method is far from sufficient at switching frequencies >20 kHz, so that the SiC (silicon carbide) power semiconductors cannot be fully utilized using conventional driver technology. Thus, using the conventional structure of the driver circuit and cooling by convection, the advantages of SiC-MOSFETs cannot be exhausted. The switching frequency of the complete drive converter has to be limited due to the minimization of power loss of the gate driver circuit. As a result, the efficiency and performance of the entire drive inverter are lost, which is perceptible at the vehicle level in a maximum range of the vehicle.

Document DE 11 2016 005 528 T5 describes a power module device, a cooling structure, and an electric vehicle.

An electric drive device for driving a vehicle is described in document DE 10 2017 222 446 A1.

A power converter and a rail vehicle are known from document DE 10 2016 207 701 A1.

SUMMARY

Against this background, one object was to improve cooling of power electronics.

The arrangement according to the invention has at least one semiconductor module made of silicon carbide as an electronic component, a driver circuit, in particular a gate driver circuit, as an electronic component for the at least one semiconductor module, and an active cooling system. Multiple semiconductor modules form a power module in this case. The arrangement can be designed or referred to as power electronics. The cooling system has at least one cooling module here, wherein the at least one semiconductor module and the driver circuit are arranged adjacent to one another, wherein the driver circuit is connected to the cooling system, for example to the at least one cooling module, and is in thermal contact with it.

In addition, it is possible that the at least one semiconductor module made of silicon carbide is also connected to the cooling system, for example to the at least one cooling module.

The arrangement can have at least one fastening module, via which the driver circuit is connected to the cooling system, i.e. to the at least one cooling module and/or to the at least one semiconductor module. The at least one fastening module can be formed as a screw and/or clamp, wherein the at least one fastening module is designed to thermally and mechanically connect the driver circuit to the at least one cooling module.

Alternatively or additionally, a thermal interface made of thermally conductive material can be arranged between the driver circuit, the at least one fastening module, and the at least one cooling module.

In one design, the driver circuit is arranged on a printed circuit board (PCB), wherein the printed circuit board and optionally at least one air gap is or are arranged between the driver circuit and the at least one semiconductor module.

The arrangement can have multiple fastening modules, wherein the at least one semiconductor module is arranged between at least two fastening modules and can also be thermally and mechanically connected thereto. In this case, the driver circuit is thermally connected to the at least two fastening modules and is connected via them to the cooling system.

The at least one cooling module of the cooling system is designed to accommodate and/or transport or convey a cooling medium, typically a cooling liquid, and to actively cool the driver circuit and possibly the at least one semiconductor module.

In one design, the arrangement can be designed in the form of layers and can have multiple layers or levels arranged adjacent to one another. A first level has at least one cooling module of the cooling system. A second level has at least one semiconductor module or power module and at least one fastening module. A third level has the driver circuit, which is arranged in one design on the printed circuit board. In this case, the first level is arranged adjacent to the second level and the second level is arranged adjacent to the third level. In one design, it is possible that the cooling system also has multiple cooling modules within the first level, which can be formed or referred to as main cooling modules and secondary cooling modules depending on the definition, but are designed independently thereof as coolers for actively cooling the semiconductor modules and the driver circuit. Multiple semiconductor modules and fastening modules can be arranged alternately adjacent to one another within the second level. It is possible here for the driver circuit to be mechanically and thermally connected via the fastening modules to cooling modules of the cooling system. In a further design, it is possible that in each case one semiconductor module in the second level can be thermally isolated from the driver circuit in the third level, wherein an air gap, for example, can be arranged in this case between each semiconductor module and the driver circuit.

Using the cooling system of the arrangement, for power electronics which have the driver circuit and the at least one semiconductor module as components of an SiC converter, active cooling of the gate driver circuit for the SiC converter is possible by connection to a main module cooler.

It is alternatively or additionally provided here that the power module of a main converter, which comprises the at least one semiconductor module made of silicon carbide, is typically cooled by the at least one cooling module using a cooling medium or a cooling liquid, for example using water. Here cooling fins or so-called PinFin structures within a closed metal cooler as a cooling module have the cooling medium or a coolant flow around them, wherein thermal energy is dissipated from the semiconductor modules by forced convection. A drive converter is based on SiC or silicon carbide and can be constructed by a half-bridge module that has the at least one semiconductor module.

Using the provided arrangement having the cooling system, the cooling of the gate driver circuit, which is also equipped above the semiconductor modules on the printed circuit board (PCB), can be improved. The electrical contact is arranged here via press-fit technology, in the case of a gate driver circuit on the printed circuit board (PCB) above the power module or the semiconductor modules. The connection to the active cooling or to a main cooler through which the coolant flows as a cooling module of the cooling system of the drive converter is provided here via a fastening screw connection and/or fastening clamp connection as a fastening module of the SiC power module. The clamp connection and/or screw connection for the fastening is seated directly on the cooling system through which coolant flows as the main cooler and thus represents an optimum heat sink. The thermal connection of the driver circuit can be implemented, for example via a thermal paste, via adhesive bonding, and/or a so-called gap pad or a cushion made of thermally conductive material, for example filler material. In this case, the clamp connection and/or fastening screw connection, which is screwed onto the cooler system through which coolant flows, is elevated until the printed circuit board and the driver circuit rest separately on the clamp connection only separated by a TIM (thermal interface material) as a thermal interface. The gate driver circuit equipped on the upper side or on a top side is connected, for example via so-called thermal vias to the active cooling.

The cooling system having the cooling modules can be used as an overall cooler for the main converter, which comprises the semiconductor modules, and for cooling the gate driver circuit. Due to the active cooling of the gate driver circuit, it can be operated without restrictions in a complete temperature range accompanying operation.

The gate driver circuit can thus be designed to be significantly reduced in relation to the prior art, which leads to a cost reduction. Moreover, the robustness of the gate driver circuit and of the entire arrangement or increased, since the components of the gate driver circuit are not subjected to an extreme temperature increase.

New options for implementing or utilizing the gate driver circuit also result due to the cooling connection. Higher switching frequencies of the drive converter made up of the semiconductor modules can thus be implemented, which directly results in better utilization of the SiC power semiconductors. This results in an increase in efficiency and performance and thus, indirectly, an increase in the range of a complete vehicle, for example an electric vehicle which has power electronics having the semiconductor modules and the arrangement.

The gate driver circuit or a gate driver substrate is directly connected to the cooling system, wherein the gate driver circuit is arranged adjacent to the at least one semiconductor module, for example above or below the power module of the at least one semiconductor module, and can be cooled actively, for example directly. Alternatively or additionally, a gate driver circuit or a gate driver IC is connected to active cooling of the cooling system, through which the coolant flows.

The cooling system is provided for the power electronics for an electric drive of the vehicle, for example an electric vehicle or hybrid vehicle. In general, a three-phase induction machine for a traction drive (EV, HEV of the PHEVs) of the vehicle is controlled using the power electronics (LE). The power electronics convert a DC direct voltage, which is provided by an electrical energy source designed, for example, as a high-voltage storage device, into a three-phase AC alternating voltage, which is designed to control an electric machine, for example designed as an induction machine. The three-phase induction machine is controlled, for example, via power semiconductors interconnected as semiconductor modules in a B6 bridge circuit. Using the gate driver or a complete gate driver circuit, precise control of the individual semiconductor switches or semiconductor modules is possible, wherein safety functions can moreover be implemented and thus safer operation of the entire vehicle can be ensured.

SiC drive converters available today or the SiC semiconductor modules thereof, which are not adequately cooled, often limit a maximum current gradient and thus a switching frequency to approximately 100 kHz due to their internal leakage inductances. Due to the cooling of the power electronics using the cooling system, high switching frequencies and switching voltages can now also be achieved for the semiconductor modules, wherein the advantages of SiC semiconductors (silicon carbide) in comparison to Si semiconductors (silicon) may be fully exhausted.

For the driver electronics it is taken into consideration that the gate capacitance of an SiC-MOSFET is comparable to that of an Si-IGBT. The control current required for the power switches or semiconductor modules results from the product of gate capacitance and switching frequency. Thus, an increase in the switching frequency from an Si-IGBT-300-A module at 10 kHz to an SiC module at 50 kHz means an increase in the necessary control power by 400%. This increased power requires new ways of dissipating heat or cooling and efficient control in order not to destroy the trend of increasing power density at the semiconductor module level by doubling the required control electronics size. The significant increase in the control power results in an increase of the power loss of the driver circuit to the same extent. This fact requires optimization of the driver circuit in order to minimize the losses over the entire temperature range.

Further advantages and designs of the invention result from the description and the accompanying drawings.

It is apparent that the above-mentioned features and the features still to be explained hereinafter are usable not only in the particular specified combination but rather also in other combinations or alone, without leaving the scope of the present invention.

BRIEF DESCRIPTION OF THE DRAWINGS

The invention is illustrated schematically in the set of drawings on the basis of embodiments, and will be described schematically and in detail with reference to the drawings.

The figures are described coherently and comprehensively; the same components are assigned the same reference numbers.

DETAILED DESCRIPTION

Figure 1:
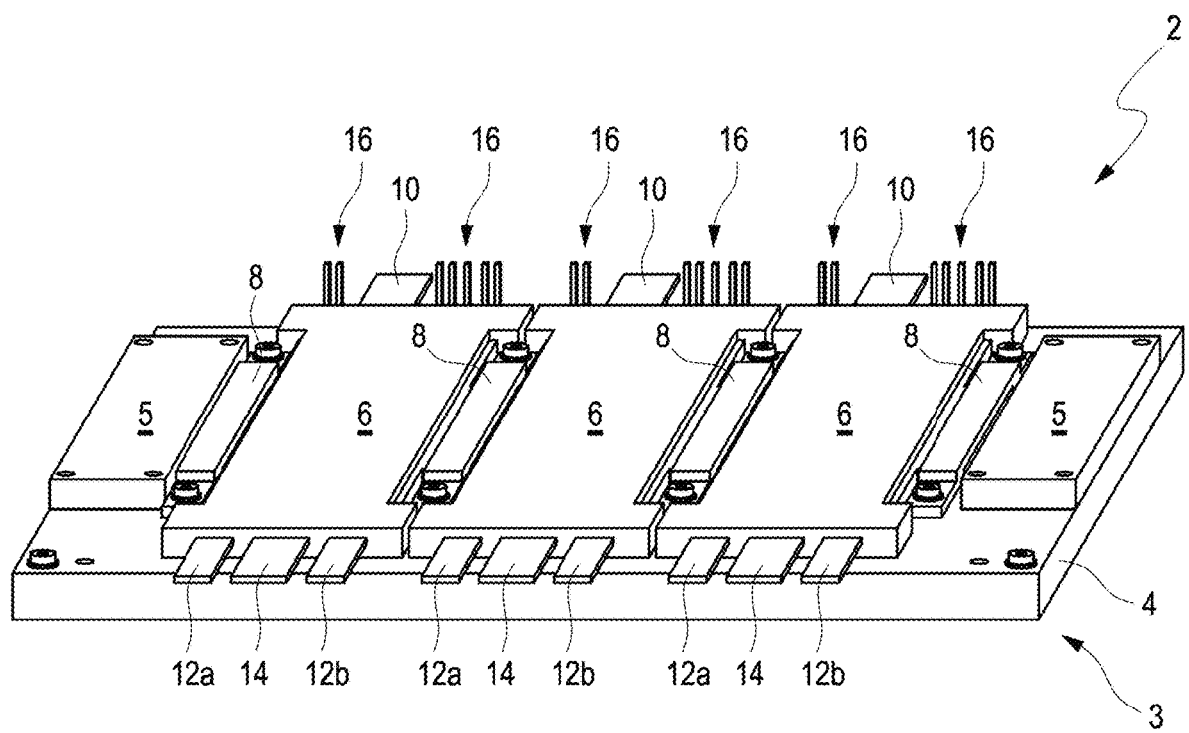
FIG. 1 shows a schematic representation of a first detail of a first embodiment of the arrangement according to the invention.
Figures 2A, 2B:
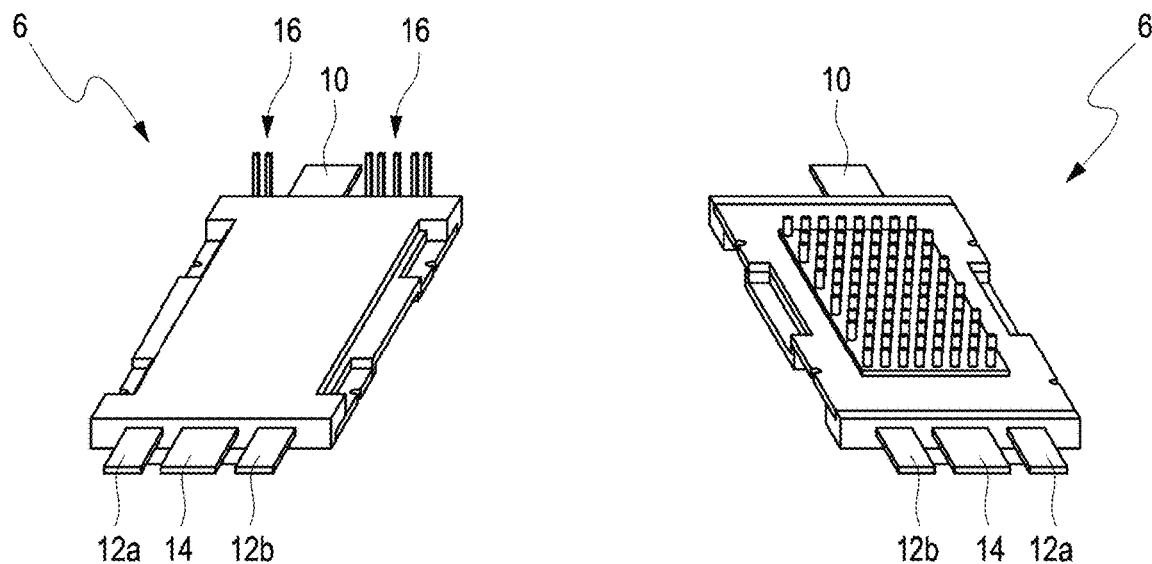
FIG. 2A shows an example of a semiconductor module from various perspectives in a schematic representation.
FIG. 2B shows another example of a semiconductor module from various perspectives in a schematic representation.

FIG. 1 shows a schematic representation of only a part of the first embodiment of the arrangement 2 according to the invention, which has a cooling system 3 here. This cooling system 3 here comprises a main cooling module 4. Three primary semiconductor modules 6 or power modules made of silicon carbide (SiC), two additional or secondary semiconductor modules 5, and four fastening modules 8 are arranged on the main cooling module 4. The semiconductor modules 5, 6, which are arranged here on the common main cooling module 4, are assigned here to an electric machine, for example an externally-excited synchronous machine. At least the primary semiconductor modules 6 are designed as components of power electronics for the electric machine. The secondary semiconductor modules 5 are designed as part of an excitation circuit for exciting the externally-excited electric machine, for example the synchronous machine. The semiconductor modules 5, 6 and the fastening modules 8 are mechanically and thermally connected to the main cooling module 4. Furthermore, a primary semiconductor module 6 is arranged between each two fastening modules 8. In addition, the semiconductor modules 6 and the fastening modules 8 are arranged between the two secondary semiconductor modules 5. A respective fastening module 8 can be formed as a fastening screw connection and/or fastening clamp connection. Such a so-called primary semiconductor module 6 is also shown from above in FIG. 2A in accordance with the illustration from FIG. 1 and from below in FIG. 2B.

Each primary semiconductor module 6 comprises a first connection terminal 10 for alternating current (AC) on a first outer side and a total of three connection terminals 12a, 12b, 14 for direct current (DC) on an opposite, second outer side. Of the second connection terminals 12a, 12b, 14, which are arranged here adjacent to one another, the two outer second connection terminals 12a, 12b are designed as connections or tabs for positive direct current (DC+) and the middle second connection terminal 14 arranged in between is designed as a connection or tab for negative direct current (DC−). In addition, control pins 16 are also arranged on the first outer side of a respective primary semiconductor module 6, which are arranged here on the primary semiconductor modules 6 via a press-fit method, wherein each primary semiconductor module 6 comprises SiC half-bridges.

Figure 3:
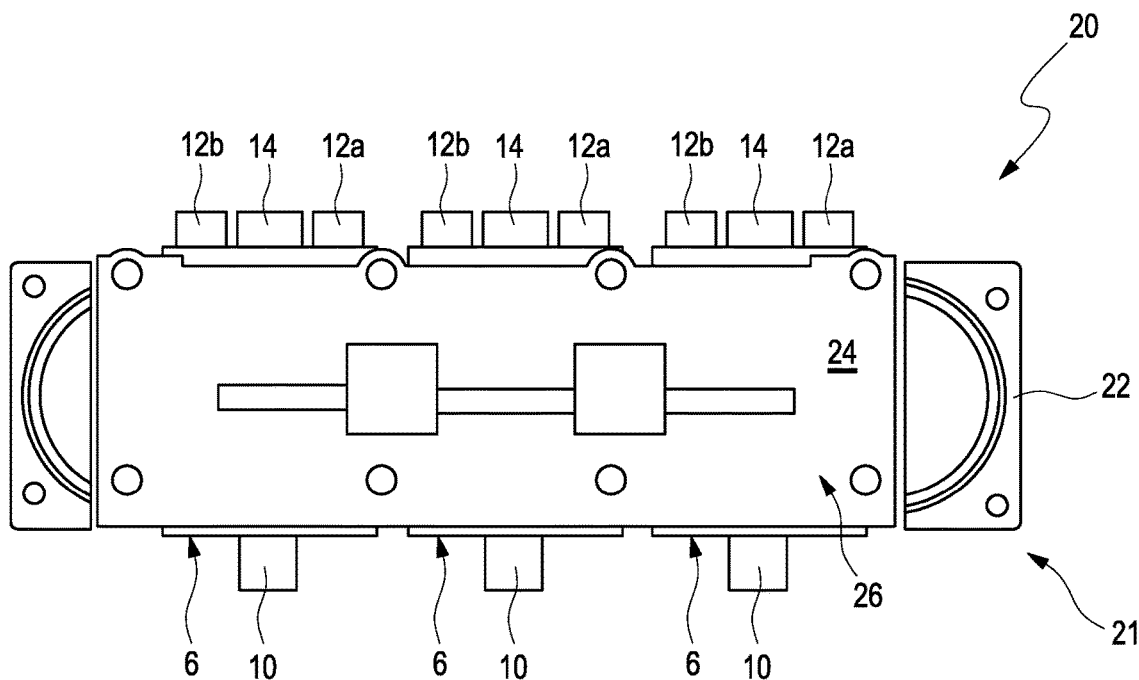
FIG. 3 shows a schematic representation of a second embodiment of the arrangement according to the invention.

The second embodiment of the arrangement 20 according to the invention, shown schematically with reference to FIG. 3, also includes a cooling system 21 having a cooling module designed as a main cooling module 22, on which three so-called primary semiconductor modules 6 having connection terminals 10, 12a, 12b, 14 are also arranged here. Here the semiconductor modules 6 are largely covered by a printed circuit board 24 (PCB), on which electronic components for a driver circuit 26, here for a gate driver circuit 26 for gates or inputs of the semiconductor modules 6, are in turn arranged. In FIG. 3, the fastening modules 8 arranged or located between the semiconductor modules 6 are also covered by the printed circuit board 24 having the driver circuit 26, wherein here in the second embodiment of the arrangement 20, it is provided that the driver circuit 26 on the printed circuit board 24 is connected via the fastening modules 8 to the main cooling module 22 and is in thermal contact.

Figure 4:
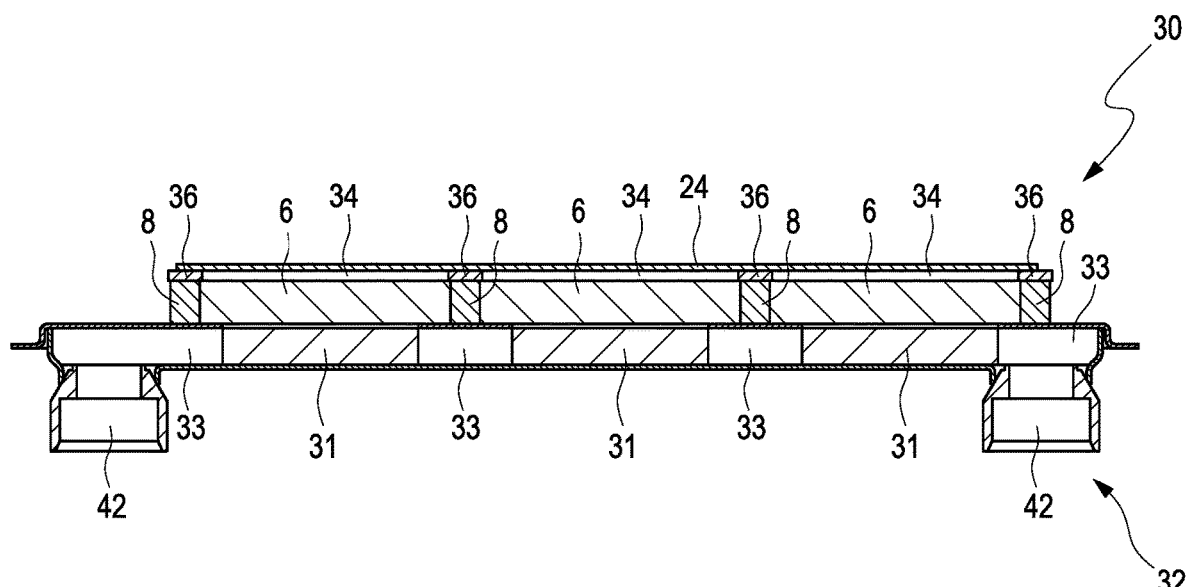
FIG. 4 shows a schematic representation of a third embodiment of the arrangement according to the invention.

The third embodiment of the arrangement 30 according to the invention is shown in FIG. 4 in a sectional illustration. This arrangement 30 also comprises a cooling system 32. This cooling system 32 here comprises cooling modules which, by definition, are designed or referred to here as main cooling modules 31 and secondary cooling modules 33; the main cooling modules 31 and the secondary cooling modules 33 are shown arranged alternately adjacent to one another in one level of the cooling system 32. On the level of the cooling system 32 formed from the cooling modules, a further level is arranged, in which three semiconductor modules 6 made of silicon carbide are also arranged adjacent to one another. In addition, this arrangement 30 here comprises four fastening modules 8 made of metal, wherein one semiconductor module 6 is arranged in the same level between each two fastening modules 8. In this arrangement 30, a semiconductor module 6 is in each case mechanically and thermally connected to a main cooling module 31. Furthermore, a fastening module 8 is in each case thermally and mechanically connected to a secondary cooling module 33.

A printed circuit board 24 or a corresponding board for a driver circuit and/or having a driver circuit for the semiconductor modules 6 arranged adjacent thereto is located above the semiconductor modules 6 or above the semiconductor modules 6 and the fastening modules 8. It is provided here that an air gap 34 is located between each semiconductor module 6 and the board 24 adjacent to it and thus also the driver circuit adjacent to it. In addition, the printed circuit board 24 having the driver circuit is connected to the cooling system 32 via the fastening module 8, clamped here. In addition, a thermal interface 36 made of thermally conductive material or a thermally conductive substance is located in each case between a fastening module 8 and the printed circuit board 24, wherein such an interface is designed and/or referred to as a TIM (thermal interface material) here. A thermal connection or a thermal contact is provided between the cooling system 32 and the driver circuit on the printed circuit board 24 via interfaces 36 of this type and the mechanical fastening modules 8. The cooling system 32 here also has two coolant feeds 42 which, depending on the definition, are designed or referred to as tabs, wherein these coolant feeds 42 are connected to the main cooling modules 31 and the secondary cooling modules 33 and are designed to provide coolant, wherein during operation of the cooling system 32, the coolant flows through the main and secondary cooling modules 31, 33.

Figure 5:
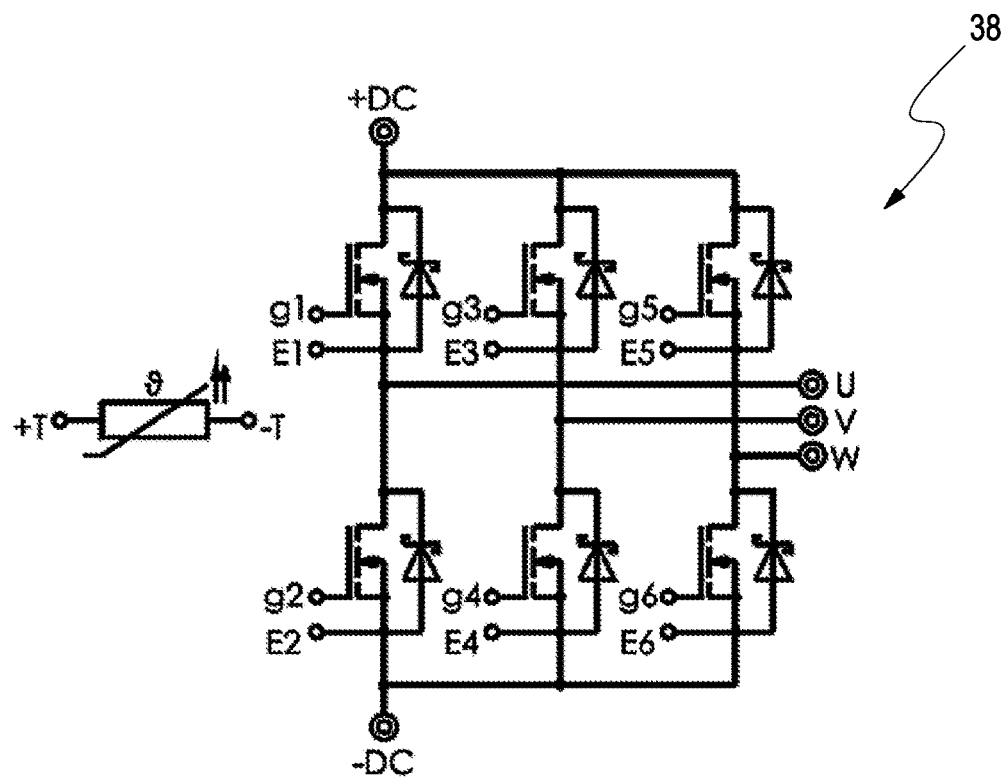
FIG. 5 shows a schematic representation of a detail of a semiconductor module.

FIG. 5 shows a schematic representation of a topology of a B6 bridge circuit here having six metal-oxide-semiconductor field effect transistors (MOSFET) made of silicon carbide as semiconductor modules, wherein a diode is assigned to each such metal-oxide-semiconductor field effect transistor.

In one design, in each case, a semiconductor module 6 of one of the provided embodiments of the arrangement 2, 20, 30 has such a bridge circuit 38.

Figure 6:
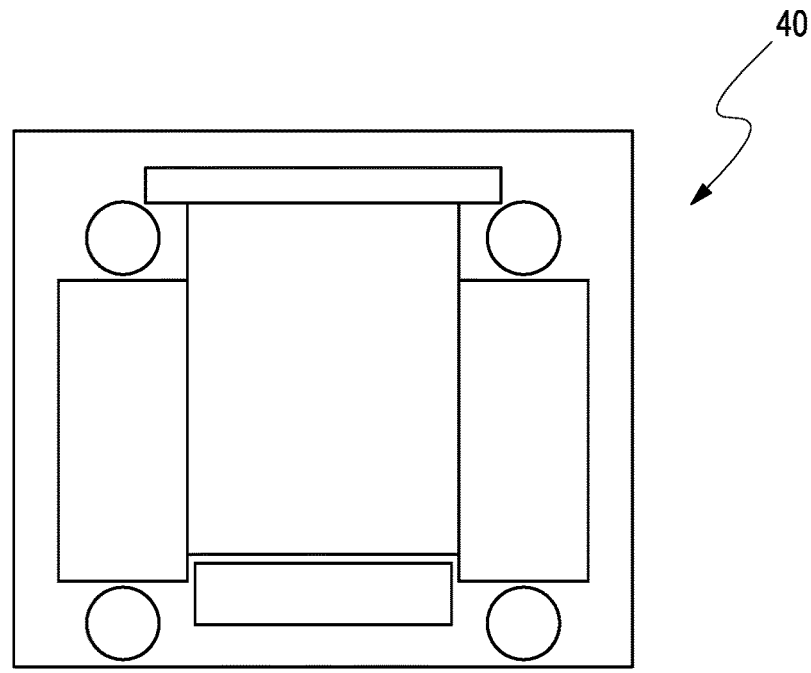
FIG. 6 shows a schematic representation of an example of a driver circuit.

FIG. 6 shows a further example of a driver circuit 40, as can also be formed as part of one of the embodiments of the provided arrangement 2, 20, 30. It is possible here for this driver circuit 40 to be arranged on a printed circuit board 24, wherein this printed circuit board 24, as in the case of the third embodiment of the arrangement 30 from FIG. 4, is adjacent to multiple semiconductor modules 6 and multiple fastening modules 8, which are arranged alternately adjacent to one another in a common level, wherein an air gap 34 can be located between the printed circuit board 24 having the driver circuit 40 and a respective semiconductor module 6, while in contrast the driver circuit 40 is thermally directly connected via the printed circuit board 24 and a respective fastening module 8 to cooling modules of a cooling system or thermally connected thereon.

In all provided embodiments of the arrangement 2, 20, 30, cooling modules, that is, depending on the definition, main cooling modules 4, 22, 31 and secondary cooling modules 33, which are arranged in a first level, form a common cooler for the semiconductor modules 6 in the second level arranged directly adjacent to it, wherein the semiconductor modules 6 are actively cooled by the cooling modules. The fastening modules 8, which can be designed or referred to as mounting clamps, for example, are arranged in the same second level as the semiconductor modules 6 and on the one hand are thermally and mechanically connected to the cooling modules in the first level directly adjacent to it, for example, below it. In addition, the fastening modules 8 are thermally and mechanically connected, on the other hand, to the driver circuit 26, 40 in the directly adjacent third level, for example, arranged above it, wherein the driver circuit 26, 40 is indirectly connected to the cooling modules via the fastening modules 8 and is thus connected to the cooling system 3, 21, 32 and is actively cooled.

The invention claimed is:

1. An arrangement, comprising:
   at least one semiconductor module made of silicon carbide;
   a driver circuit for the at least one semiconductor module;
   a plurality of fastening modules, and
   a cooling system,
   wherein each of the at least one semiconductor module is secured to the cooling system by two of the plurality of fastening modules,
   wherein the plurality of fastening modules thermally couples the driver circuit to the cooling system, and
   wherein an upper surface of the at least one semiconductor module is at least partially exposed and an air gap is provided between the driver circuit and the exposed upper surface of at least one semiconductor module.

2. The arrangement as claimed in claim 1, wherein a thermal interface is provided between the driver circuit and the plurality of fastening modules, the thermal interface comprising a thermally conductive material.

3. The arrangement as claimed in claim 1, wherein the plurality of fastening modules comprises at least one of a screw and a clamp.

4. The arrangement as claimed in claim 1, wherein the driver circuit is arranged on a printed circuit board, wherein the circuit board is arranged between the driver circuit and the plurality of fastening modules.

5. The arrangement as claimed in claim 1, in which the cooling system has multiple cooling modules, wherein the driver circuit is connected to at least one cooling module.

6. The arrangement as claimed in claim 1, in which the cooling system is designed to accommodate a cooling medium and to actively cool the driver circuit.

7. The arrangement as claimed in claim 6, wherein each of the at least one semiconductor module comprises a heat conductive structure around which the cooling medium flows to dissipate thermal energy.

8. The arrangement as claimed in claim 7, wherein the heat conductive structure is a plurality of cooling fins or a plurality of pin fins.

9. The arrangement as claimed in claim 1, wherein the at least one semiconductor module comprises a connection terminal for alternating current and three connection terminals for direct current, two of the three connection terminals provided for a first polarity and one of the three connection terminals provided for a second polarity.

10. The arrangement as claimed in claim 9, wherein the at least one semiconductor module further comprises a plurality of control pins.

11. The arrangement as claimed in claim 1, wherein the plurality of fastening modules mechanically couples the driver circuit to the cooling system, and
    wherein the mechanical coupling is provided independent of or in addition to the thermal coupling.

12. The arrangement as claimed in claim 11, wherein a thermal interface is provided between the driver circuit and the plurality of fastening modules, the thermal interface comprising a thermally conductive material.

13. The arrangement as claimed in claim 1, wherein the at least one semiconductor module is a plurality of semiconductor modules, and
    wherein one or more of the plurality of fastening modules are each arranged between a respective two of the plurality of semiconductor modules and secures both of the respective two of the plurality of semiconductor modules to the cooling system.

14. The arrangement as claimed in claim 1, further comprising two secondary semiconductor modules configured as part of an excitation circuit.

15. The arrangement as claimed in claim 14, wherein the two secondary semiconductor modules are arranged on each side of the at least one semiconductor module, and
    wherein each of the plurality of fastening modules are arranged between a respective two of: the at least one semiconductor module and the two secondary semiconductor modules.

16. The arrangement as claimed in claim 14, wherein the at least one semiconductor module is a plurality of semiconductor modules and the two secondary semiconductor modules are arranged on each side of the plurality of semiconductor modules,
    wherein one or more of the plurality of fastening modules are each arranged between a respective two of the plurality of semiconductor modules and secures both of the respective two of the plurality of semiconductor modules to the cooling system, and
    wherein one of the plurality of fastening modules are arranged adjacent to and between each of the two secondary semiconductor modules and a corresponding one of the plurality of semiconductor modules.

17. The arrangement as claimed in claim 15, wherein the two secondary semiconductor modules are secured to the cooling system independently of the plurality of fastening modules.

18. The arrangement as claimed in claim 16, wherein the two secondary semiconductor modules are secured to the cooling system independently of the plurality of fastening modules.

* * * * *